(12) United States Patent  (10) Patent No.: US 7,320,423 B2
Suresh et al.  (45) Date of Patent: *Jan. 22, 2008

(54) HIGH SPEED LINEAR AND ROTARY SPLIT-AXIS WIRE BONDER

(75) Inventors: Krishnan Suresh, Madison, WI (US); David T. Beatson, Kennett Square, PA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 17 days.

This patent is subject to a terminal disclaimer.

(21) Appl. No.: 10/715,809

(22) Filed: Nov. 17, 2003

(65) Prior Publication Data

US 2004/0129754 A1 Jul. 8, 2004

Related U.S. Application Data

(60) Provisional application No. 60/427,788, filed on Nov. 19, 2002.

(51) Int. Cl.
*B23K 37/00* (2006.01)
*B23K 31/00* (2006.01)
*B23K 31/02* (2006.01)

(52) U.S. Cl. .................... 228/4.5; 228/180.5

(58) Field of Classification Search .............. 228/1.1, 228/4.5, 180.5, 6.1, 6.2; 219/56.21, 56.22
See application file for complete search history.

(56) References Cited

U.S. PATENT DOCUMENTS

| | | | | |
|---|---|---|---|---|
| 4,266,710 A | | 5/1981 | Bilane et al. ............... 228/4.5 |
| 4,361,261 A | * | 11/1982 | Elles et al. ................ 228/103 |
| 4,422,568 A | * | 12/1983 | Elles et al. ................ 228/111 |
| 4,550,871 A | * | 11/1985 | Chan et al. ............... 228/4.5 |
| 4,792,079 A | * | 12/1988 | Bansemir .................. 228/1.1 |
| 5,156,318 A | * | 10/1992 | Suzuki et al. .............. 228/4.5 |
| 5,699,951 A | * | 12/1997 | Miyoshi ................... 228/4.5 |
| 5,735,449 A | | 4/1998 | Magni |
| 5,839,640 A | * | 11/1998 | Kinnaird ................... 228/4.5 |
| 5,897,048 A | * | 4/1999 | Cheng et al. ............ 228/180.5 |
| 5,901,896 A | * | 5/1999 | Gal .......................... 228/4.5 |
| 5,909,837 A | * | 6/1999 | Safabakhsh et al. ....... 228/6.2 |
| 5,931,372 A | * | 8/1999 | Miller .................... 228/180.5 |
| 5,979,739 A | | 11/1999 | Jin et al. |
| 6,109,501 A | * | 8/2000 | Cheng et al. .............. 228/1.1 |
| 6,122,307 A | * | 9/2000 | Koseki ..................... 372/107 |
| 6,126,432 A | * | 10/2000 | Okada et al. .............. 425/375 |

(Continued)

*Primary Examiner*—Jonathan Johnson
*Assistant Examiner*—Rachel E. Beveridge
(74) *Attorney, Agent, or Firm*—Christopher M. Spletzer, Sr.

(57) ABSTRACT

A wire bonding machine is disclosed for bonding a wire to a semiconductor device. The wire bonding machine includes a wire bonding head having a bonding tool mounted to it. The bonding tool is adapted to attach a wire end to a semiconductor device. At least a portion of the bonding head is pivotable about a first horizontal axis so as to provide vertical displacement of the bonding tool. The bonding head is also rotatably mounted to the bonding machine so as to permit rotation of the bonding tool about a vertically oriented rotational axis. The machine also includes a work table for supporting at least one semiconductor device to be wire bonded. A conveyance system is used to translate the work table in a direction relative to the bonding head and in a substantially orthogonal direction to the horizontal pivot axis of the bonding head.

24 Claims, 5 Drawing Sheets

U.S. PATENT DOCUMENTS

| | | | |
|---|---|---|---|
| 6,434,726 B1 * | 8/2002 | Goossen | 716/5 |
| 6,460,751 B1 | 10/2002 | Thürlemann | |
| 6,616,030 B2 * | 9/2003 | Miller | 228/4.5 |
| 6,640,423 B1 * | 11/2003 | Johnson et al. | 29/740 |
| 6,774,651 B1 * | 8/2004 | Hembree | 324/758 |
| 6,913,838 B2 * | 7/2005 | McCullough et al. | 428/614 |
| 2002/0162875 A1 | 11/2002 | Miller | |
| 2003/0084563 A1 * | 5/2003 | Ohkubo et al. | 29/740 |
| 2005/0247758 A1 * | 11/2005 | Beatson et al. | 228/103 |

* cited by examiner

FIG. 8B

HIGH SPEED LINEAR AND ROTARY SPLIT-AXIS WIRE BONDER

CROSS-REFERENCE TO RELATED APPLICATIONS

The present invention is related to and claims priority from co-pending U.S. Provisional Patent Application Ser. No. 60/427,788, filed Nov. 19, 2002, incorporated herein by reference in its entirety.

FIELD OF THE INVENTION

The present invention relates to the field of wire bonding equipment and, more particularly, to an improved wire bonder which uses linear and rotation movement of the bonding head for providing high speed bonding.

BACKGROUND OF THE INVENTION

Wire bonding processes and machines are used extensively as a practical and expedient method to bond wires to semiconductors. One example of the use of wire bonders in a semiconductor manufacturing process is for attaching a semiconductor dies directly to a circuit board substrate. The substrate includes numerous traces which terminate in pads that are positioned adjacent to the place where the die is to be mounted. The package itself includes numerous die pads that are to be electrically connected to the pads on the circuit board. A wire bonder is used to attach a conductive wire, typically having a diameter of between 0.00051 to 0.030 inches, to each die pad and then to the pads on the circuit board. The configuration of the die and the location of the pads require that the wire bonds be formed at varying X, Y and Z locations.

Automatic wire bonders have been developed which utilize stored position data for each wire bond. The wire bonders use the position data to control the bonding operation. The most common bonder uses a vertically or rotary (Z direction) displaceable wire bonding head along with a translatable (in the X, Y direction) semiconductor work table. Three high speed motors (one associated with each direction of movement) are used to position the semiconductor device and bonding tool at the appropriate locations.

Generally, the speed of a bonding machine is measured by the number of units that are completed per hour (or, alternatively, the number of wires bonded per hour.) One way to reduce the costs associated with the manufacture of a semiconductor product is to increase the speed of the bonding machine to increase the number of units produced per hour. The high speeds of current machines require the bonding head and the table to move at accelerations of between 10 and 12 g's. Increasing the accelerations above this range has been difficult due to the large mass and inertia that is involved in moving the various components of the bonding machines.

A need, therefore, exists for an improved wire bonding machine which provides high speed bonding.

SUMMARY OF THE INVENTION

The present invention relates to a wire bonding machine for bonding a wire to a semiconductor device. The wire bonding machine includes a wire bonding head having a bonding tool mounted to it. The bonding tool is adapted to attach a wire end to a semiconductor device. At least a portion of the bonding head is pivotable about, or slides perpendicular to, a first horizontal axis so as to provide vertical displacement of the bonding tool. The bonding head is also rotatably mounted to the bonding machine so as to permit rotation of the bonding tool about a vertically oriented rotational axis.

The wire bonding machine also includes a work table for supporting at least one semiconductor device to be wire bonded. A conveyance system is incorporated to translate the work table in a direction relative to the bonding head and in a substantially orthogonal direction to the horizontal pivot axis of the bonding head.

The foregoing and other features of the invention and advantages of the present invention will become more apparent in light of the following detailed description of the preferred embodiments, as illustrated in the accompanying figures. As will be realized, the invention is capable of modifications in various respects, all without departing from the invention. Accordingly, the drawings and the description are to be regarded as illustrative in nature, and not as restrictive.

BRIEF DESCRIPTION OF THE DRAWINGS

For the purpose of illustrating the invention, the drawings show a form of the invention which is presently preferred. However, it should be understood that this invention is not limited to the precise arrangements and instrumentalities shown in the drawings.

DETAILED DESCRIPTION OF THE PREFERRED EMBODIMENTS

Figure 1:
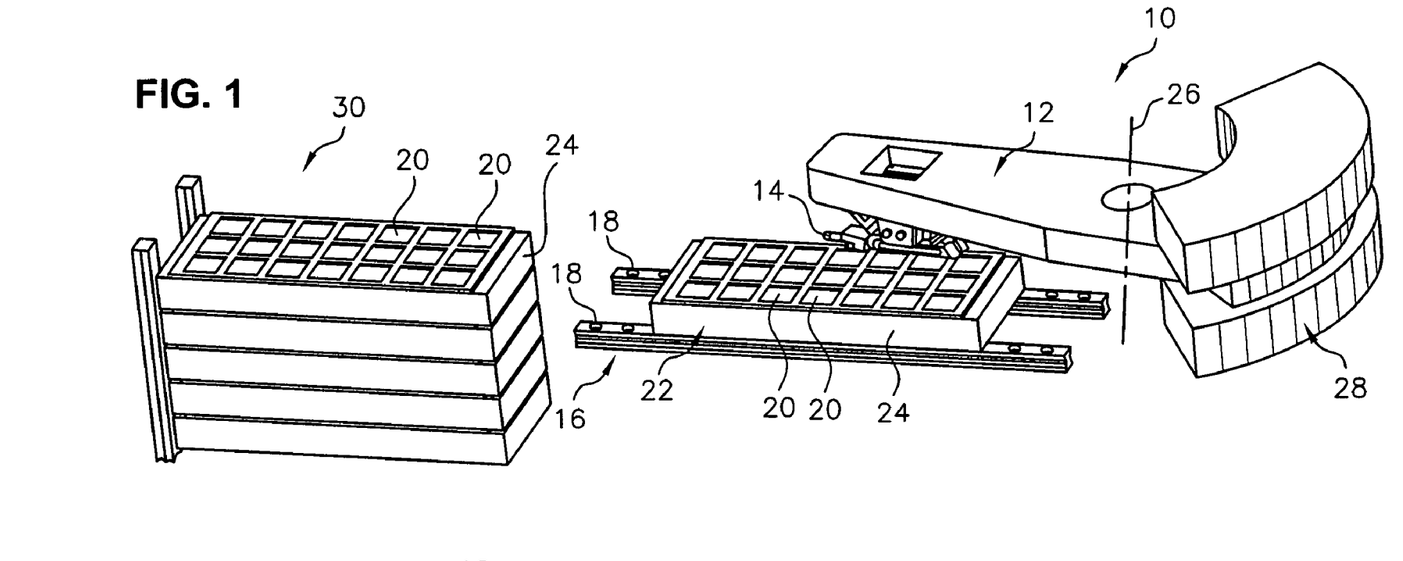
FIG. 1 is a side perspective view of a portion of a wire bonding machine according to the present invention illustrating a bonding head, a work table and a portion of a conveyance system.

Referring now to the drawings, wherein like reference numerals illustrate corresponding or similar elements throughout the several views, FIG. 1 is a perspective view of a portion of a wire bonding machine 10 according to one preferred embodiment of the present invention. The wire bonding machine includes a wire bonding head 12 which has a bonding tool 14 attached to it for dispensing and/or channeling a wire to a workpiece. Many of the detailed features of the wire bonding head 12 are conventional in the art and are not necessary for an understanding of the present invention. As such, no discussion is provided in this application. Similarly, many of the aspects of the wire bonding machine are conventional and, therefore, are also not described herein. Those skilled in the art are familiar with the general construction and arrangement of such components, and would be readily capable of applying the teachings provided herein to such machines.

The bonding head 12 is positioned above a high speed conveyance system 16, which, in the illustrated embodiment, may include a conventional set of guide rails 18 and a motor drive (not shown), for translating the workpiece 20 (e.g., a semiconductor device) relative to the bonding head 12. Any conventional wire bonding conveyance system may be used in the present invention. More particularly, the workpiece 20 is mounted on a work table 22 that includes a fixture 24 which holds one or more workpieces 20. The fixture 24 (or magazine) may be supplied to the high speed conveyance system 16 by a magazine handler 30 as shown in FIG. 1.

One difference between the present invention and current systems is that the conveyance system 16 provide translation of the work table 22 in one direction, e.g., the X-axis direction, for purposes of positioning the workpiece 20 and to provide the high speed bonding motion relative to the bonding tool 14. Contrary to conventional bonding machines which use the conveyance system to position the workpiece and control the X and Y position of the bonding tool 14 relative to the workpiece, the present invention uses the positional control of the bonding head 12 to control the Y and Z position of the bonding tool 14 relative to the workpiece 20. The bonding tool 14 is controllable along both the Y-axis and Z-axis for positioning the bonding tool 14 relative to the workpiece. As a consequence, the Y-axis positional control is split from the X-axis positional control and from the work table 22 entirely.

More particularly, the bonding head 12, in addition to controlling the vertical location (i.e., in the Z direction) of the bonding tool 14, also is rotatable in the X-Y plane, i.e., rotatable about a vertical rotational or pivot axis 26. This allows the bonding head 12 to provide control over the Y-axis position of the bonding tool 14 relative to the worktable 22 and, thus, the workpiece 20. A pivotal or rotational mount 28, such as a pin and/or bearing, attaches the bonding head 12 to the bonding machine so as to permit angular (rotational) movement of at least the bonding tool portion of the bonding head 12.

Figure 2:
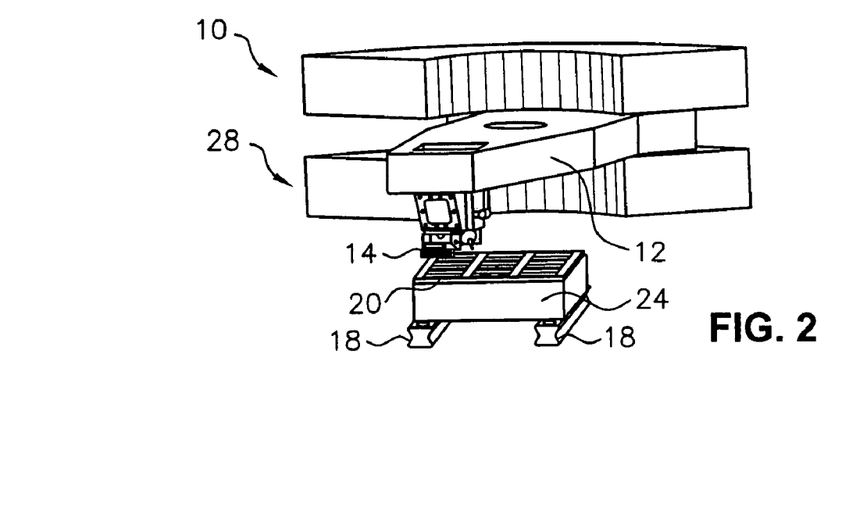
FIG. 2 is a front perspective view of the bonding head and work table of FIG. 1.
Figure 3:
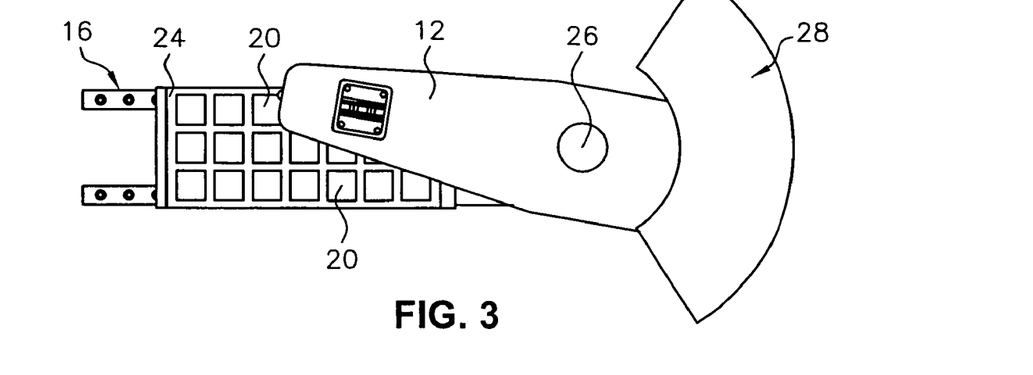
FIG. 3 is a top plan view of the wire bonding head and work table of FIG. 1 illustrating the position of several workpieces relative to the head at one stage of the bonding operation.
Figure 4:
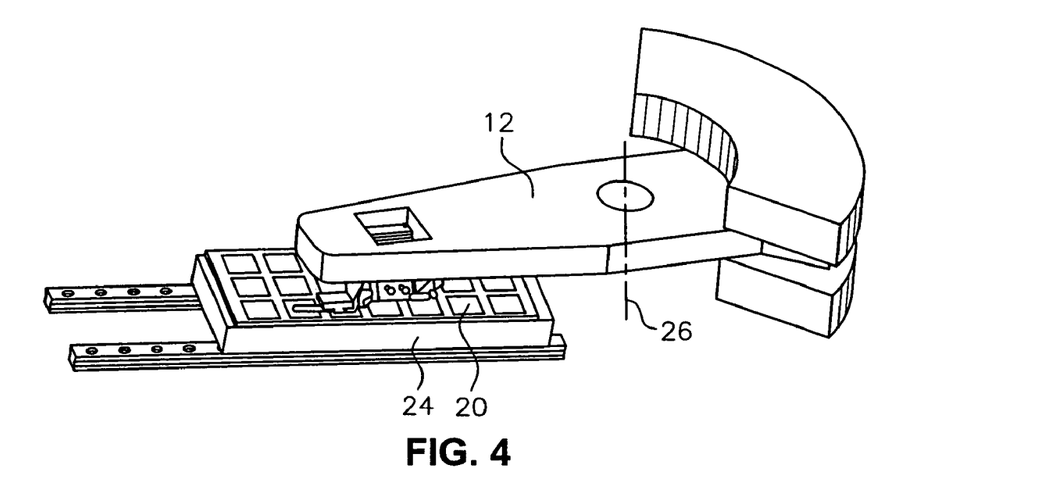
FIG. 4 is a side perspective view of the bonding head and work table of FIG. 1 illustrating the position of the workpieces relative to the head at another stage of the bonding operation.
Figure 5:
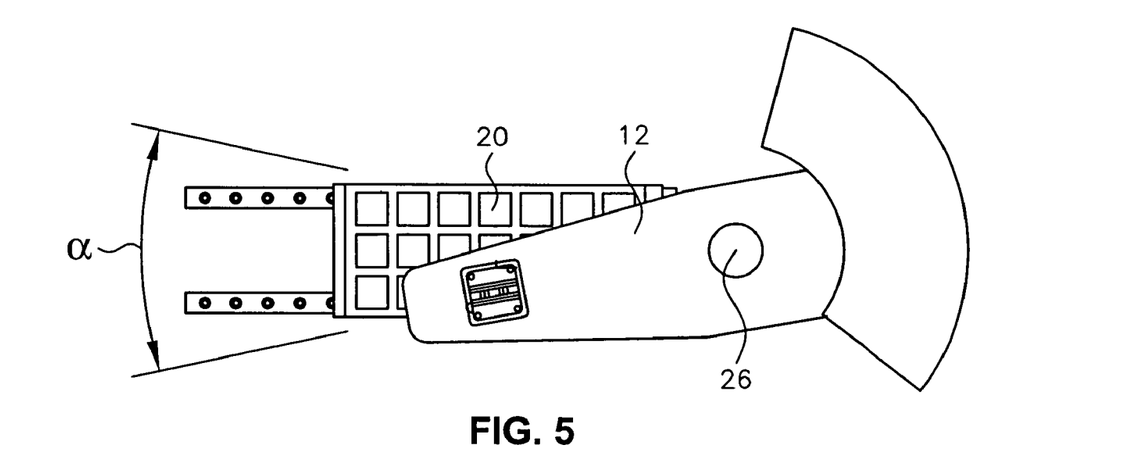
FIG. 5 is a top plan view of the wire bonding head and work table of FIG. 4.

Referring to FIGS. 1-5, the rotation of the bonding head 12 along the X-Y plane (horizontal plane) can be seen more clearly. FIGS. 1-3 illustrate a first position of the bonding head 12, and in particular the bonding tool 14, with respect to a workpiece 20. The rotational connection between the bonding head 12 and the bonding machine 10 permits the bonding head 12 to be rotated about a vertical axis 26, thus providing positioning of the bonding tool 14 along the Y-axis. FIGS. 4 and 5 show a second position in the X-Y plane of the bonding head 12 and tool 14 relative to the workpiece 20. The workpiece 20 and work table 22 have not been moved. Only the bonding head 12 has changed position. As illustrated, the pivoting of the bonding head 12 permits the bonding tool 14 to rotate along an arcuate path through an angle ox relative to the workpiece 20. The amount of angular rotation cc that is provided by the bonding head 12 would be determined based on the amount of movement in the Y direction that would be required for the anticipated semiconductors, and where the rotational axis 26 of the bonding head 12 is located relative to the bonding tool 14.

It should also be apparent that the angular movement of the bonding head 12 provides, in addition to positional change in the Y-direction, some positional change in the X-direction too. Thus, the programming which controls the movement of the bonding tool 14 and worktable 12 to properly position the tool 14 for bonding, must take into account both the rotation of the bonding head 12 and translation of the worktable 22 when determining the position of the worktable 22 in the X-direction for achieving a bond.

The bonding head 12 is mounted to the bonding machine 10 through a conventional attachment which permits the bonding tool 14 to move vertically (i.e., in the Z-direction) relative to the work piece 20. U.S. Pat. No. 4,266,710, the disclosure of which is incorporated herein by reference in its entirety, describes one type of mounting arrangement that could be used in the present invention. The mounting arrangement may include a pivot or hinge mount which permits the bonding tool 14 to move up and down in the Z-direction (toward and away from the workpiece) so as to permit the bonding of the wires to the semiconductor device at various vertical positions. Those skilled in the art are familiar with such mounting arrangements as well as other mechanisms for vertical positioning of a bonding tool and, therefore, no further discussion is needed. The present invention can be readily incorporated into many conventional wire bonders, such as Kulicke & Soffa's 8028 Ball Bonder or Maxµm IC Ball Bonder.

Preferably, the pivotal or hinged mounting of the bonding tool 14 or head 12 (for Z-axis positioning) is located outboard of the rotational mounting location (i.e., outboard of the rotational axis 26). This reduces the mass of components and/or material that needs to be moved to raise and lower the bonding tool 14.

In order to rotate the bonding head 12 about the rotational axis 26, the present invention incorporates a motor drive assembly 28. The motor drive assembly 28 is preferably mounted or engaged with the bonding head 12 on the opposite side of the rotational axis 26 from the bonding tool 12. By mounting the motor drive assembly 28 on the opposite side of the rotational axis 26 from the bonding tool 12, it is possible to reduce the force needed to rotate the bonding tool 14. More particularly, it is desirable to substantially balance the mass of the components of the bonding head 12 on opposite sides of the rotational axis 26. This balancing of the masses reduces dynamic vibration causes by the motion of the boning head, as well as reduces the braking force needed to overcome the momentum of the bonding head 12 when reciprocating the bonding head 12 back and forth. Thus, locating the bonding tool 14 and the motor drive assembly 28 on opposites sides of the rotational axis 26 greatly increases the rotational acceleration of the bonding head 12.

Those skilled in the art would be readily capable of mounting the motor drive assembly 28 to the bonding head 12 so as to maximize the speed and capabilities of the bonding tool 14 and bonding head 12 in light of the teachings provided herein.

Figure 6A:
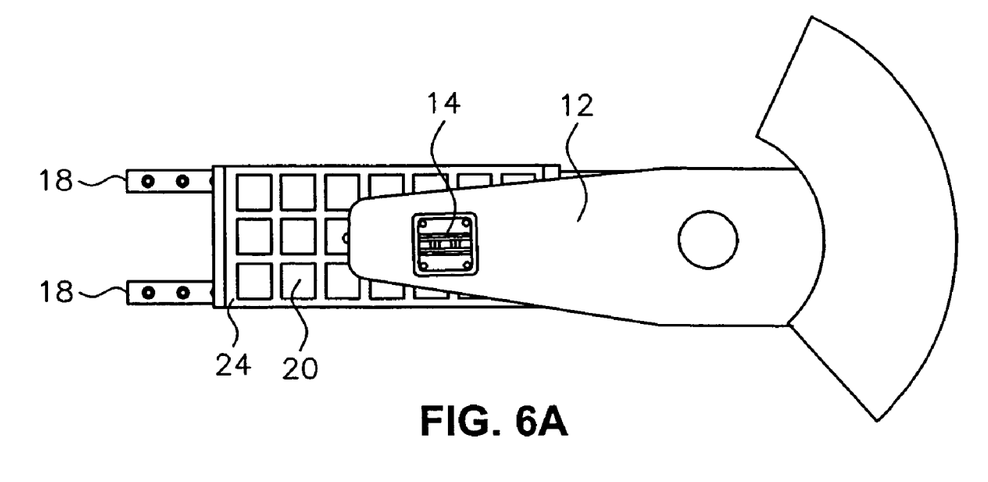
FIGS. 6A and 6B are top views of the bonding head and work table of FIG. 1 illustrating the position of the workpiece relative to the head along the X-direction at two different stages of the bonding operation.
Figure 6B:
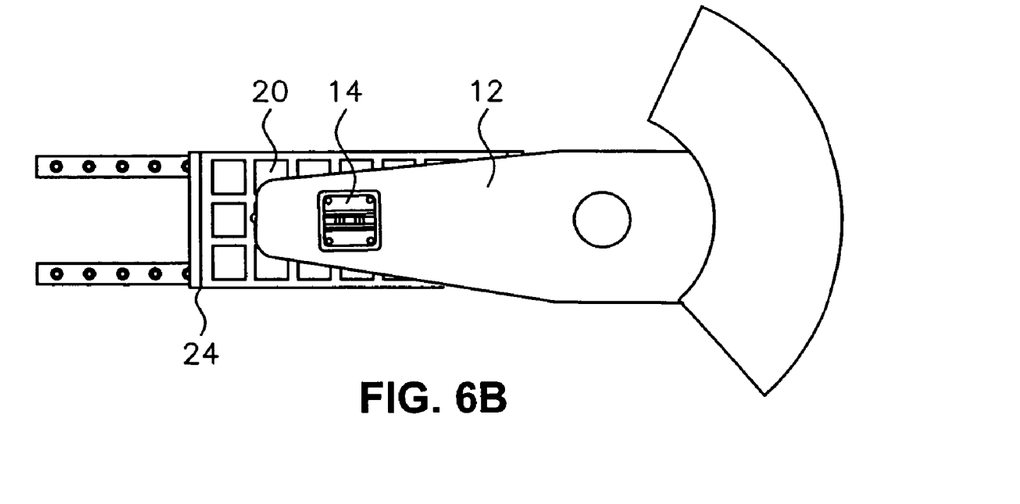

As described above, the present invention controls translation of the work table 22 (and, thus, the work piece 20) along the X-axis by translating the table along guide rails 18. Referring to FIGS. 6A and 6B, two positions of the work table 22 relative to the bonding head 12 are shown, illustrating the translation of the table 22 under the bonding head 12. It is contemplated that the rails 18 would preferably extend completely under the bonding head 12 such that the travel of the work table would be along a linear path from the left side of the figures to the right side and out of the bonding machine 10. This arrangement is different from conventional wire bonding machines where the feed direction of the work table is generally orthogonal to the longitudinal axis of the bonding head. The illustrated embodiment permits the footprint of the overall bonding machine 10 to be reduced considerably, thus taking up less factory space which provides a cost savings to customers.

Figure 7:
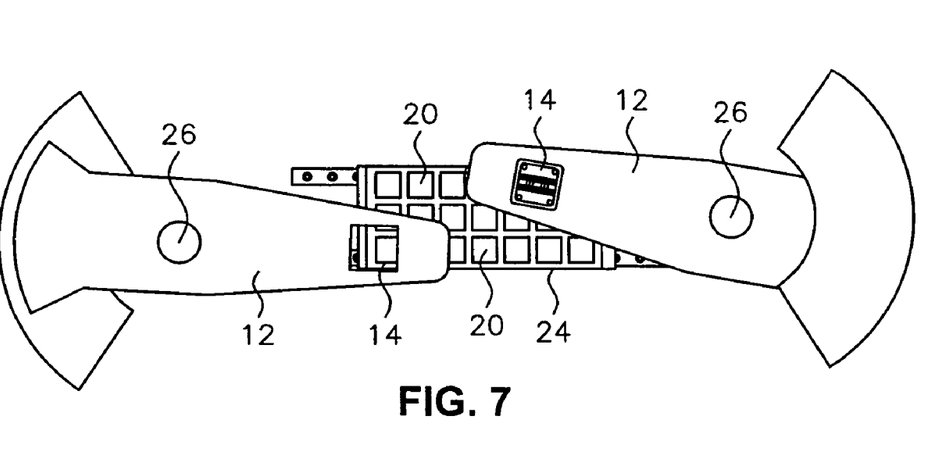
FIG. 7 is a top view of a second embodiment of the present invention which uses two bonding heads for attaching wire bonds on a single work table.

Referring now to FIG. 7, a variation on the present invention is shown. In this embodiment of the invention, there are two bonding heads 12 mounted above the worktable 22. Each bonding head includes a bonding tool 12 which is mounted so as to bond wires to the semiconductor device 20. The two bonding heads 12 are both preferably mounted so as to be rotatable with respect to the work table 22. This embodiment of the invention speeds up the manufacturing process by increasing the number of units that can be completed at a time in certain wiring configurations. It is further contemplated that multiple bonding heads can be used, and/or that multiple bonding tools could be mounted to a single bonding head to further accelerate the bonding process using the present invention.

Figure 8A:
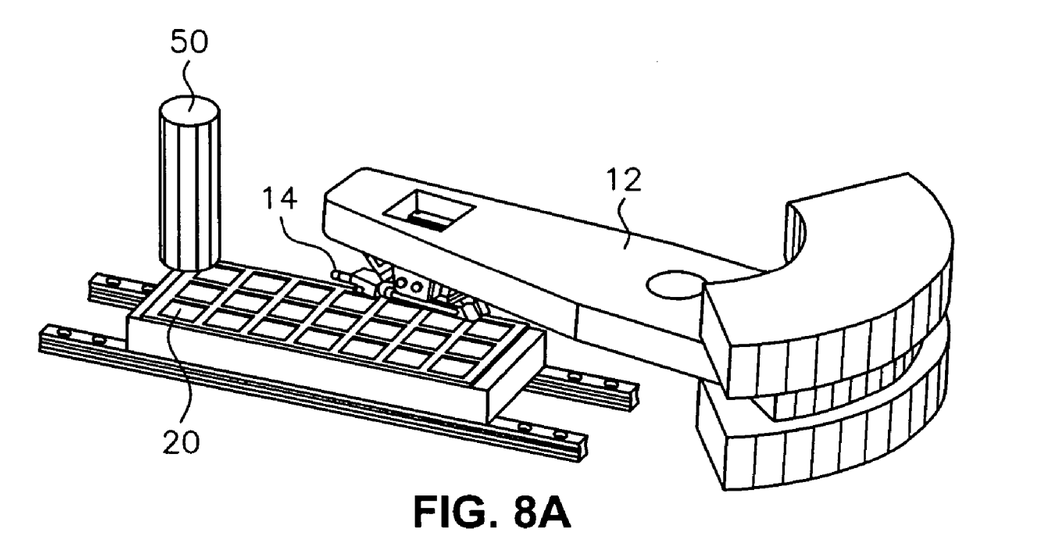
FIGS. 8A and 8B are isometric views of additional embodiments of the present invention which incorporate a camera.
Figure 8B:
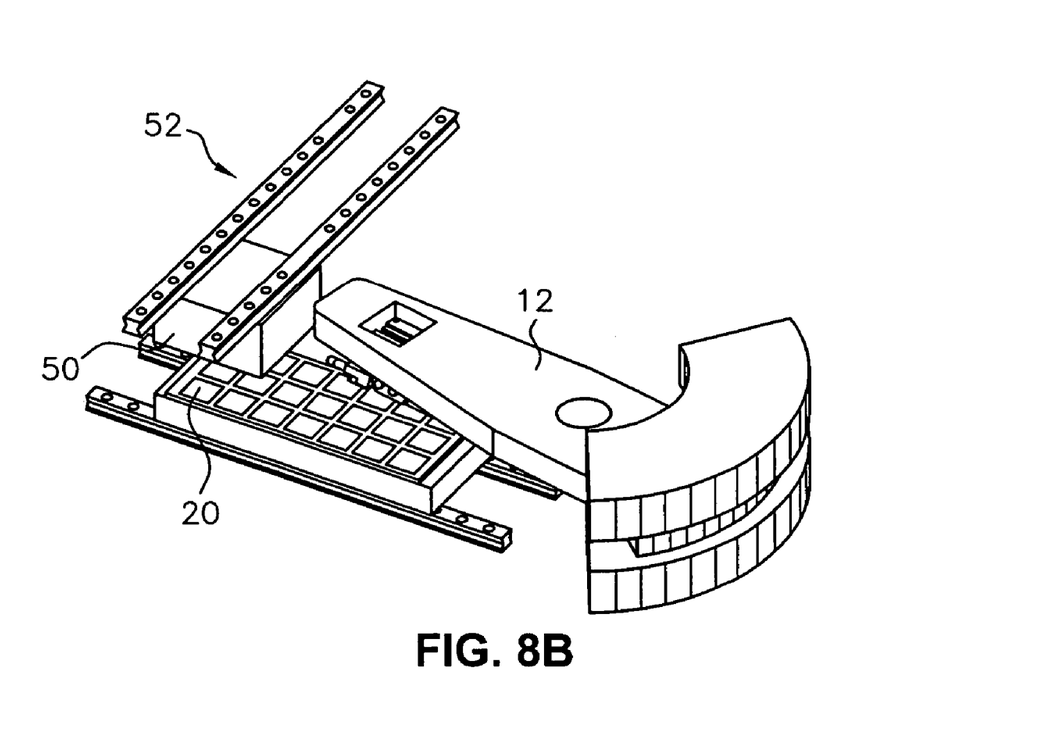

Turning now to FIGS. 8A and 8B, isometric views of another embodiment of the present invention is shown which incorporates a camera for recording/storing image data related to the workpiece 20. Specifically, the camera stores position data, such as X-Y location and orientation, of the workpiece 20 and/or bonding locations on the workpiece 20. The data is fed to a microprocessor or similar controller for use in controlling the head 12 and tool 14. In FIG. 8A, a fixed line scan camera 50 is used. The camera does not move but, instead, retrieves information related to the entire table on a line by line basis. In FIG. 8B the camera 50 is mounted to a conveyance system 52 which carries the camera 50 along the Y-axis. Thus, the camera 50 scans across the table in the Y-direction as the table moves the workpieces along the X-axis.

Alternatively, the camera may be mounted to the bonding head 12, such that it reciprocates with the head. A further embodiment is contemplated wherein the camera 50 is mounted to a separate rotary head which permits the camera 50 to be rotated in the theta (θ) direction about a Z-axis. The camera would be mounted in much the same manner as the second bonding head in FIG. 7.

Conventional software is used to retrieve, store and extract position data for use by the bonding head. Accordingly, no further discussion is needed.

In an alternate embodiment (not shown), two bonding heads could be balanced on opposite sides of the rotational axis such that as the bonding tool on a first head is translated down the bonding tool on the opposite head would be raised up. Thus, two workpieces can be bonded at the same time. Separate cameras would be necessary for each bonding head and each workpiece should be mounted on a work table that can be independently controlled.

The present invention may be embodied in other specific forms without departing from the spirit or essential attributes thereof and, accordingly, reference should be made to the appended claims, rather than to the foregoing specification, as indicating the scope of the invention.

What is claimed is:

1. A wire bonding machine for bonding a wire to a semiconductor device, the wire bonding machine comprising:

a fixture supporting at least one semiconductor device to be wire bonded in a substantially horizontal plane;

a wire bonding head supporting a bonding tool, the wire bonding head being rotatably mounted to a portion of the wire bonding machine to permit rotation of the bonding tool about a substantially vertical axis, the bonding tool being rotatable about a substantially horizontal axis alone or in combination with the wire bonding head, the wire bonding head being configured to provide motion of the bonding tool along only one of (a) a substantially horizontal x-axis direction and (b) a substantially horizontal y-axis direction;

a positioning system for positioning the fixture in a substantially horizontal direction; and a camera for receiving an image of at least one of the fixture or the at least one semiconductor device, the camera being supported by the bonding head.

2. A wire bonding machine according to claim 1 further comprising a second wire bonding head mounted above the positioning system.

3. A wire bonding machine according to claim 1 wherein the substantially horizontal x-axis direction is substantially orthogonal to the substantially horizontal y-axis direction.

4. A wire bonding machine according to claim 1 wherein the fixture supporting the at least one semiconductor device is a magazine which supports at least one other semiconductor device.

5. A wire bonding machine according to claim 4 further comprising a magazine handler for feeding the magazine to the positioning system.

6. The wire bonding machine according to claim 1 wherein the bonding head has a longitudinal axis and the positioning system translates the fixture in a direction at an acute angle with respect to the longitudinal axis of the bonding head.

7. The wire bonding machine according to claim 1 wherein the bonding tool is rotatable about the substantially horizontal axis for movement of the bonding tool in a vertical direction.

8. The wire bonding machine according to claim 7 wherein at least a portion of the wire bonding head is rotatable about the substantially horizontal axis and the bonding tool is secured to the portion of the wire bonding head to rotate about the substantially horizontal axis.

9. The wire bonding machine according to claim 1 further comprising a motor drive assembly engaged with the wire bonding head on an opposite side of the vertical axis from the bonding tool.

10. The wire bonding machine according to claim 1 further comprising a second wire bonding head including a second bonding tool supported thereby, the second wire bonding head rotatably mounted to a portion of the wire bonding machine to permit rotation of the second bonding tool about a second vertical axis.

11. The wire bonding machine according to claim 1 wherein the camera is mounted to a camera conveyance system which carries the camera in a substantially horizontal direction.

12. A wire bonding machine for bonding a wire to a semiconductor device, the wire bonding machine comprising:

a fixture supporting at least one semiconductor device to be wire bonded in a substantially horizontal plane;

a wire bonding head supporting a bonding tool, the wire bonding head being rotatably mounted to a position of the wire bonding machine to permit rotation of the bonding tool about a vertical axis; and a motor drive assembly engaged with the wire bonding head on an opposite side of the vertical axis from the bonding tool, the bonding head having a mass that is substantially balanced on opposite sides of the vertical axis.

13. A method of operating a wire bonding system, the wire bonding system being configured to bond a wire to a workpiece, the method comprising the steps of:
  (1) positioning a workpiece supported by a work table by moving the work table prior to performing a high speed wire bonding operation on the workpiece;
  (2) moving a bond head of the wire bonding system in a first substantially horizontal direction during the high speed wire bonding operation wherein the high speed wire bonding operation is the process of attaching a conductive wire between bonding locations on the workpiece, the bond head supporting a bonding tool; and
  (3) moving the workpiece in a second substantially horizontal direction during the high speed wire bonding operation by moving the work table with a high speed conveyance system, wherein the second substantially horizontal direction is different from the first substantially horizontal direction, and wherein the movement of the workpiece in step (3) is distinct from the positioning of the workpiece in step (1).

14. The method of claim 13 further comprising the step of: (4) pivoting the bonding tool about a substantially horizontal axis to provide a vertical range of motion for the bonding tool.

15. The method of claim 13 wherein step (2) comprises rotating the bond head about a vertical axis to provide motion in the first substantially horizontal direction.

16. The method of claim 13 wherein step (2) comprises moving the bond head in the first substantially horizontal direction, the first substantially horizontal direction being a Y-axis direction.

17. The method of claim 13 wherein step (3) comprises moving the workpiece in the second substantially horizontal direction, the second substantially horizontal direction being an X-axis direction.

18. The method of claim 13 further comprising the step of: moving a second bond head supporting a second bonding tool in the first substantially horizontal direction during the wire bonding operation.

19. The method of claim 13 wherein step (3) comprises moving the workpiece in the second substantially horizontal direction such that the motion in the second substantially horizontal direction is orthogonal to motion in the first substantially horizontal direction.

20. The method of claim 13 wherein step (3) comprises moving a plurality of workpieces, in a magazine, in the second substantially horizontal direction.

21. The method of claim 13 wherein step (3) comprises moving the workpiece in the second substantially horizontal direction such that the second substantially horizontal direction is substantially parallel to a longitudinal axis of the bond head.

22. The method of claim 13 wherein step (3) comprises moving the workpiece in the second substantially horizontal direction such that the second substantially horizontal direction is at an acute angle with respect to a longitudinal axis of the bond head.

23. The method of claim 13 further comprising receiving an image of at least one of the workpiece and a fixture supporting the workpiece using a camera.

24. The method of claim 23 further comprising moving the camera along a substantially horizontal axis.

* * * * *